United States Patent [19]
Prysby et al.

[11] Patent Number: 5,384,816
[45] Date of Patent: Jan. 24, 1995

[54] FREQUENCY DIVIDER CIRCUIT

[75] Inventors: Daniel G. Prysby, Elk Grove; Matthew J. DiMarco, Chicago, both of Ill.

[73] Assignee: Texas Instruments Incorporated, Dallas, Tex.

[21] Appl. No.: 135,840

[22] Filed: Oct. 13, 1993

[51] Int. Cl.[6] .......................................... H03K 21/00
[52] U.S. Cl. ............................................... 377/48
[58] Field of Search ......................................... 377/48

[56] References Cited

U.S. PATENT DOCUMENTS

| 5,214,682 | 5/1993 | Clark | 377/48 |
| 5,224,132 | 6/1993 | Goldberg | 377/48 |
| 5,235,531 | 8/1993 | Foerg | 377/48 |

*Primary Examiner*—Margaret R. Wambach
*Attorney, Agent, or Firm*—Christopher L. Maginniss; W. James Brady, III; Richard L. Donaldson

[57] ABSTRACT

A programmable divide-by-N or divide-by-N+½ circuit is responsive to an input clock signal and to a plurality of binary-coded data signals corresponding to the divisor for providing an output clock signal having a frequency which is the frequency of the input clock signal divided by the value encoded on the data signals. The circuit includes two separate down counters 10, 12—one decrementing on the positive-going edge of the input clock signal and the other decrementing on the negative-going edge of the input clock signal.

If the divisor is an integer N, the negative-clocked circuitry 12 is disabled and the positive-clocked circuit 10 counts down from N to 1 continuously. If the divisor is N+½, both counter circuits are used. In this case, both counters are preset with the value N, the positive-edge-triggered counter 10 decrements from N to zero while the negative-edge-triggered counter 12 decrements from N to one. Then, both are preset with the value N, and this time the positive-edge-triggered counter 10 decrements to one while the negative-edge-triggered counter 12 decrements to zero. This count swapping occurs continuously. The resulting output signals are combined in a shaping circuit 14 to produce a frequency-divided output signal having a preselected low-state pulse width.

8 Claims, 4 Drawing Sheets

FREQUENCY DIVIDER CIRCUIT

BACKGROUND OF THE INVENTION

The present invention relates generally to digital electronic circuits and, more particularly, to digital logic frequency divider circuits which may be programmed to divide the frequency of an input clock signal by either N or N+½.

There are many instances in which a digital electronics subsystem requires a clocking signal which, under program control, may assume any one of a number of frequencies. One such example is a FAX/modem interface used in a personal computer system, which may require the capability of selecting from a large number of clock frequencies derived from an input clock signal in order to drive an internal Universal Asynchronous Receiver/Transmitter (UART). The divider circuits which have traditionally performed this function typically provide integer division of the input clock frequency under program control. It will be recognized, however, that limiting the number of available frequencies to just the number of integer divisors may be excessively restrictive in many applications, and it is often desired to generate those additional frequencies which are the integer-plus-a-half divisors of the input clock frequency.

Prior art digital divider circuits which provide such integer-plus-a-half frequency division typically include a circuit which doubles the frequency of the input clock signal. Such circuits use the frequency-doubled clock signal with a programmable counter set to 2N+1 in order to provide a N+½ frequency division. One such input clock signal frequency doubler comprises an exclusive OR gate having the input clock signal coupled to a first of its input terminals, and the input clock signal passed through a time delay element coupled to the second input terminal. In this way, for an appropriately selected delay time in relation to the input clock frequency, there will be two instances per clock cycle where the clock signal and the delayed clock signal are oppositely poled. Thus, the output signal from the exclusive OR gate will have two clock cycles for each cycle of the input clock signal. One drawback of this arrangement is that the delay element and its variation limit the highest frequency at which the divider can be used. Furthermore, the programmable counter must be capable of operation at twice the frequency of the input clock signal. This operational requirement of the counter may be impractical, as such a counter is typically designed to operate at or near its upper frequency limit when clocked by the input clock signal, and is entirely incapable of operating at twice that speed.

Another prior art approach, which is somewhat more complex than the exclusive OR gate frequency doubler approach, employs a phase locked loop (PLL) to double the frequency of the input clock, in a manner well known in the art, and uses the frequency-doubled clock signal with a programmable counter set to 2N+1 in order to provide a N+½ frequency division, as described above. A PLL is traditionally a linear function. A digital PLL would require a fixed reference clock of at least twice the input clock frequency. This approach would require that the PLL operate at twice the frequency of the input clock signal, and, as in the above-mentioned approach, the programmable counter would also have to be capable of operation at twice the frequency of the input clock signal.

In view of the above, it is clear that there exists a need to develop an improved programmable divider circuit, for dividing the frequency of an input clock by either N or N+½, than is currently known in the art.

SUMMARY OF THE INVENTION

In accordance with the principles of the present invention, there is disclosed herein a frequency divider circuit comprising first input means for receiving an input clock signal and second input means for receiving data signals corresponding to a divisor value, the divisor value being either an integer or an integer plus one-half. The divider circuit also comprises first counter means responsive to the data signals and to the positive-going transitions of the input clock signal for generating a first counter signal. The divider circuit additionally comprises second counter means responsive to the data signals and to the negative-going transitions of the input clock signal for generating a second counter signal. Finally, the divider circuit comprises means for combining the first and second counter signals to thereby provide an output signal having frequency equal to the frequency of the input clock signal divided by the divisor value.

Further in accordance with the present invention there is disclosed a frequency divider circuit comprising first input means for receiving an input clock signal and second input means for receiving data signals corresponding to a divisor value, the divisor value being either an integer or an integer plus one-half. The frequency divider circuit further comprises means responsive to the second input means for determining whether the divisor value is an integer or a non-integer. The frequency divider circuit also comprises first counter means responsive to the data signals and to the positive-going transitions of the input clock signal for generating a first counter signal, and second counter means responsive to the data signals and to the negative-going transitions of the input clock signal for generating a second counter signal. The frequency divider circuit additionally comprises means coupled to the determining means and to the second counter means for inhibiting the generating of the second counter signal when the determining means determines that the divisor value is an integer. The frequency divider circuit further comprises means coupled to the determining means and to the first and second counters for enabling the counters to count down continuously from the integer portion of the divisor value to a final count when the determining means determines that the divisor value is a non-integer, the final count alternating between one and zero, the enabling means further providing that while one of the first and second counters counts down to one, the other of the first and second counters counts down to zero. Finally, the frequency divider circuit comprises means for combining the first and second counter signals to thereby provide an output signal having frequency equal to the frequency of the input clock signal divided by the divisor value.

BRIEF DESCRIPTION OF THE DRAWING

The foregoing features of the present invention may be more fully understood from the following detailed description, read in conjunction with the accompanying drawings, wherein.

DESCRIPTION OF THE PREFERRED EMBODIMENT

Figure 1:
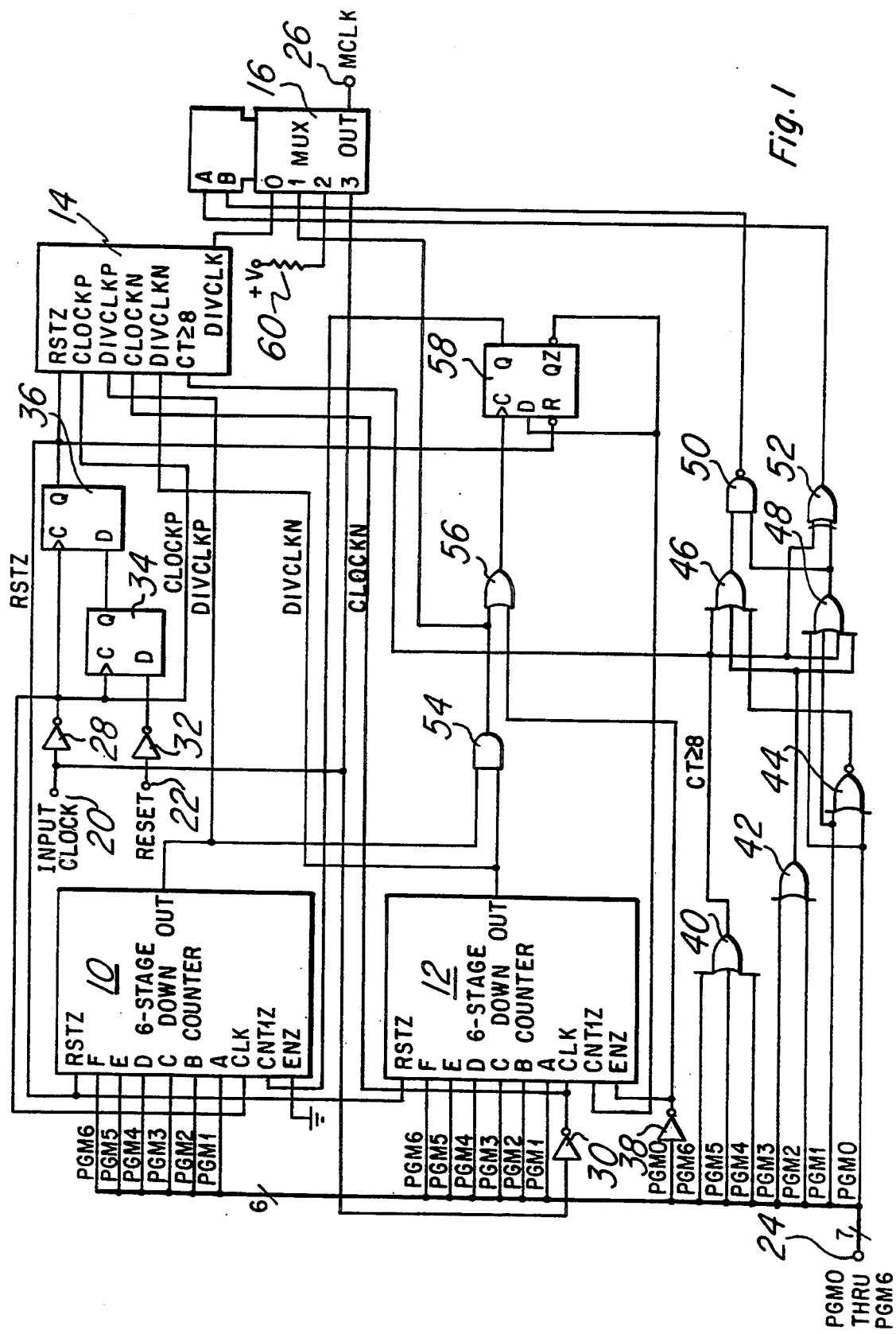
FIG. 1 is a logic block diagram of a frequency divider in accordance with the present invention.

The description which follows is closely tailored to the implementation of the specific embodiment shown in the figures. Nevertheless, it will be recognized that many variants of this embodiment will be considered obvious by those skilled in the art in view of the disclosed embodiment, and such variants are deemed to be included within the scope of this invention.

The present invention comprises a programmable divide-by-N or divide-by-N+½ circuit, responsive to an input clock signal and to a plurality of binary-coded data signals corresponding to the divisor for providing an output clock signal having a frequency which is the input clock signal frequency divided by the value encoded on the data lines. In the implementation described herein, this circuit permits the division of the input clock signal by any value of integer or integer-plus-one-half between two and 63½. The circuit includes two separate down counters—one decrementing on the positive-going edge of the input clock signal and the other decrementing on the negative-going edge of the input clock signal.

If the divisor is an integer N, the negative-clocked circuitry is disabled and the positive-clocked circuitry counts down from N to 1 continuously. If the divisor is N+½, both counter circuits are used. In this case, both counters are preset with the value N, the positive-edge-triggered counter decrements from N to zero while the negative-edge-triggered counter decrements from N to one. Then, both are preset with the value N, and this time the positive-edge-triggered counter decrements to one while the negative-edge-triggered counter decrements to zero. This count swapping occurs continuously. The resulting output signals are combined to produce an output clock signal which, in the disclosed embodiment, has a low-state pulse width equal to 1.5 input clock periods, for values of the divisor which are greater than 1.5 but less than eight. For values of the divisor which are eight or greater, the output signals from the two down-counters are combined in a shaping circuit which stretches the low-state pulse width of the frequency divider to four input clock periods, for a divisor value which is an integer, and to four-and-one-half input clock periods, for a divisor value which is an integer-plus-one-half. When the preset value of the divisor is ½, 1 or 1½, the output clock signal is the same as the input clock, and a steady high logic level is generated at the output when the preset value of the divisor is equal to zero.

The above-described parameters, i.e., those relating to the maximum value that the divisor may assume, the specified wigs of the output pulses, and the rules for dealing with values of the divisor less than two, are considered arbitrary and were governed by the applicants' particular requirements. As such, they are not deemed to be a limitation of the invention. Indeed, one of skill in the art will be able to modify these specified parameters from an understanding of the detailed description of the invention which follows.

Referring now to FIG. 1, there is shown a logic block diagram of a frequency divider in accordance with the present invention. The divider includes a first six-stage down counter 10 which is responsive at its CLK input terminal to the normal phase, i.e., the positive-going edge, of the signal INPUT CLOCK which is coupled at input terminal 20. In the present invention, the INPUT CLOCK signal ideally has a fifty percent duty cycle, and it will be recognized that the precision of the divider in its divide-by-N+½ mode depends on the closeness to that fifty percent ideal. The divider also includes a second six-stage down counter 12 which is responsive to the inverted phase, i.e., the negative-going edge, of the signal INPUT CLOCK, which is coupled to the CLK input terminal of counter 12 via inverter 30. Counters 10 and 12 are also responsive to a plurality of data inputs which determine the initial value from which the counters initiate down-counting. In the present example, seven data signals, PGM0 through PGM6, coupled at input terminals 24, permit the counters to be preset to an initial integer count of 0 to 63 using binary coding of the six signals PGM1 through PGM6, and a one-half count using signal PGM0. Counters 10 and 12 are identical in their internal structure. This structure is depicted in logic diagram form in FIG. 2, and is described in detail in later paragraphs.

AND gate 54 combines the output signal from counter 10, DIVCLKP, with the output signal from counter 12, DIVCLKN. It will be seen from a later discussion of counters 10 and 12 with particular regard to FIG. 2, that the DIVCLKP and DIVCLKN signals are normally logic high levels, and that they pulse to a logic low level for one full clock pulse when their programmed count is reached. Since counters 10 and 12 are clocked out of phase with respect to one another, the output signal from AND gate 54 will be at a logic low level for 1½ clock pulses each time the count of a programmed value of N+½ is achieved.

The output signal from AND gate 54 is coupled to the "1" input to multiplexer 16 and to a first input of OR gate 56. The second input of OR gate 56 is coupled to the data signal PGM0 as inverted by inverter 38. The effect of the inverted PGM0 signal on OR gate 56 is to hold its output high when PGM0 is low, i.e., the divisor value is an integer N, and to permit its output to reflect the output state of AND gate 54 when PGM0 is high, i.e., the divisor value is N+½. The output of OR gate 56 is coupled to the clock (C) input terminal of D-type flip-flop 58, which is configured in a toggle mode, i.e., its reset state (QZ) output terminal is coupled to its data (D) input terminal. The set state (Q) output terminal of flip-flop 58 is coupled to the CNT1Z input terminal of counter 10, and the QZ output terminal of flip-flop 58 is coupled to the CNT1Z input terminal of counter 12. It will be clear, from the later detailed description of the down-counter of FIG. 2, that flip-flop 58 controls the final count to be decoded by counters 10 and 12—either a final count of one or a final count of zero.

The combination of flip-flops 34 and 36 form a one-shot arrangement for the generation of a low logic level reset signal RSTZ for use by the various registers of the frequency divider of FIG. 1. The arrangement shown ensures that the duration of RSTZ will be at least one cycle of the signal INPUT CLOCK. The inactive state of the input signal RESET coupled at input terminal 22 is low. In this state inverter 32 applies a constant high logic level to the data (D) input of flip-flop 34, causing the flip-flop to be held in a set condition, and resulting in a steady high logic level at its Q output. The signal at the Q output of flip-flop 34 is coupled to the D input of flip-flop 36, causing it to be held in a set condition, resulting in a steady high logic level at its Q output, which forms the RSTZ signal.

When the RESET signal is activated, i.e., it rises to its high logic level, the output of inverter 32 goes low, and the next following positive-going transition of the signal INPUT CLOCK, coupled through buffer 28, resets flip-flop 34 by clocking a low logic level at the D input to its Q output, and the next successive positive-going transition of INPUT CLOCK causes flip-flop 36 to reset by clocking a low logic level at the D input to its Q output, causing a low logic pulse on the RSTZ signal. With this configuration of flip-flops 34 and 36, so long as the RESET signal is at a high logic level long enough to be clocked into flip-flop 34, a logic low pulse on the RSTZ signal having duration at least one period of the INPUT CLOCK signal will result.

The combinatorial logic elements comprising gates 40 through 52 are responsive to the seven data signals, PGM0 through PGM6, which are coupled at input terminals 24, for providing gating signals relating to the programmed value of the divisor. OR gate 40, coupled to the three most significant data signals, PGM4, PGM5 and PGM6, provides a high logic level signal when the programmed value of the divisor is eight or greater. OR gate 42, coupled to data signals PGM2 and PGM3, provides a high logic level signal when the programmed value of the divisor is between 2 and 7.5 inclusive, or between 10 and 15.5, inclusive, or between 18 and 23.5, inclusive, etc. NOR gate 44, coupled to data signals PGM0 and PGM1, provides a high logic level signal when the programmed value of the divisor is 0, 2, 4, 6, 8, 10, etc. OR gate 46, coupled to the outputs of OR gates 40 and 42 and NOR gate 44, provides a high logic level signal when the programmed value of the divisor is either 0 or 2 or greater. That is to say, the output of OR gate 46 provides a low logic level signal when the programmed value of the divisor is between 0.5 and 1.5, inclusive. OR gate 48, coupled to the outputs of OR gates 40 and 42 and to data signals PGM0 and PGM1, provides a high logic level signal when the programmed value of the divisor is greater than 0. That is to say, the output of OR gate 48 provides a low logic level signal when the programmed value of the divisor is 0. NAND gate 50, coupled to the outputs of OR gates 46 and 48, provides a low logic level signal at the "B" input terminal of multiplexer (MUX) 16 when the programmed value of the divisor is 2 or greater. That is to say, the output of NAND gate 50 provides a high logic level signal when the programmed value of the divisor is between 0 and 1.5, inclusive. Exclusive OR gate 52, coupled to the outputs of OR gate 40 and OR gate 48, provides a high logic level signal at the "A" input terminal of MUX 16 when the programmed value of the divisor is greater than 0 and less than 8.

Shaping circuit 14 is responsive to the output signals from down-counters 10 and 12, and to the output signal from OR gate 40, indicating whether or not the encoded value of the divisor is at least eight, to provide a low-state pulse of the width specified above among the operating parameters. The structure of shaping circuit 14 is depicted in logic diagram form in FIG. 3, and is described in detail in later paragraphs.

MUX 16 is responsive to control signals applied at its "A" and "B" inputs for selecting from among the input signals at its "0," "1," "2" and "3" inputs to be steered through to its output terminal (OUT). The signal at the MUX 16 output, MCLK, is coupled to output terminal 26, and comprises the divided clock output of the frequency divider of the present invention. In the present example, the DIVCLK output signal from shaping circuit 14 is coupled to the "0" input of MUX 16; this signal is steered through MUX 16 when the signal levels at the "A" and "B" inputs are both low. This condition occurs when the output signal levels of NAND gate 50 and exclusive OR gate 52 are both at logic low, i.e., when the programmed value of the divisor is eight or greater. The output signal from AND gate 54, the combined outputs of down-counters 10 and 12, is coupled to the "1" input of MUX 16; this signal is steered through MUX 16 when the signal level at the "A" input is high and the signal level at the "B" input is low. This condition occurs when the programmed value of the divisor is between 2 and 7.5, inclusive. A logic high voltage level is coupled through pull-up resistor 60 to the "2" input of MUX 16; this signal is steered through MUX 16 when the signal level at the "A" input is low and the signal level at the "B" input is high. This condition occurs only when the programmed value of the divisor is 0. Finally, the INPUT CLOCK signal is coupled to the "3" input of MUX 16; this signal is steered through MUX 16 when the signal levels at the "A" and "B" inputs are both high. This condition occurs when the programmed value of the divisor is between 0.5 and 1.5, inclusive.

Figure 2:
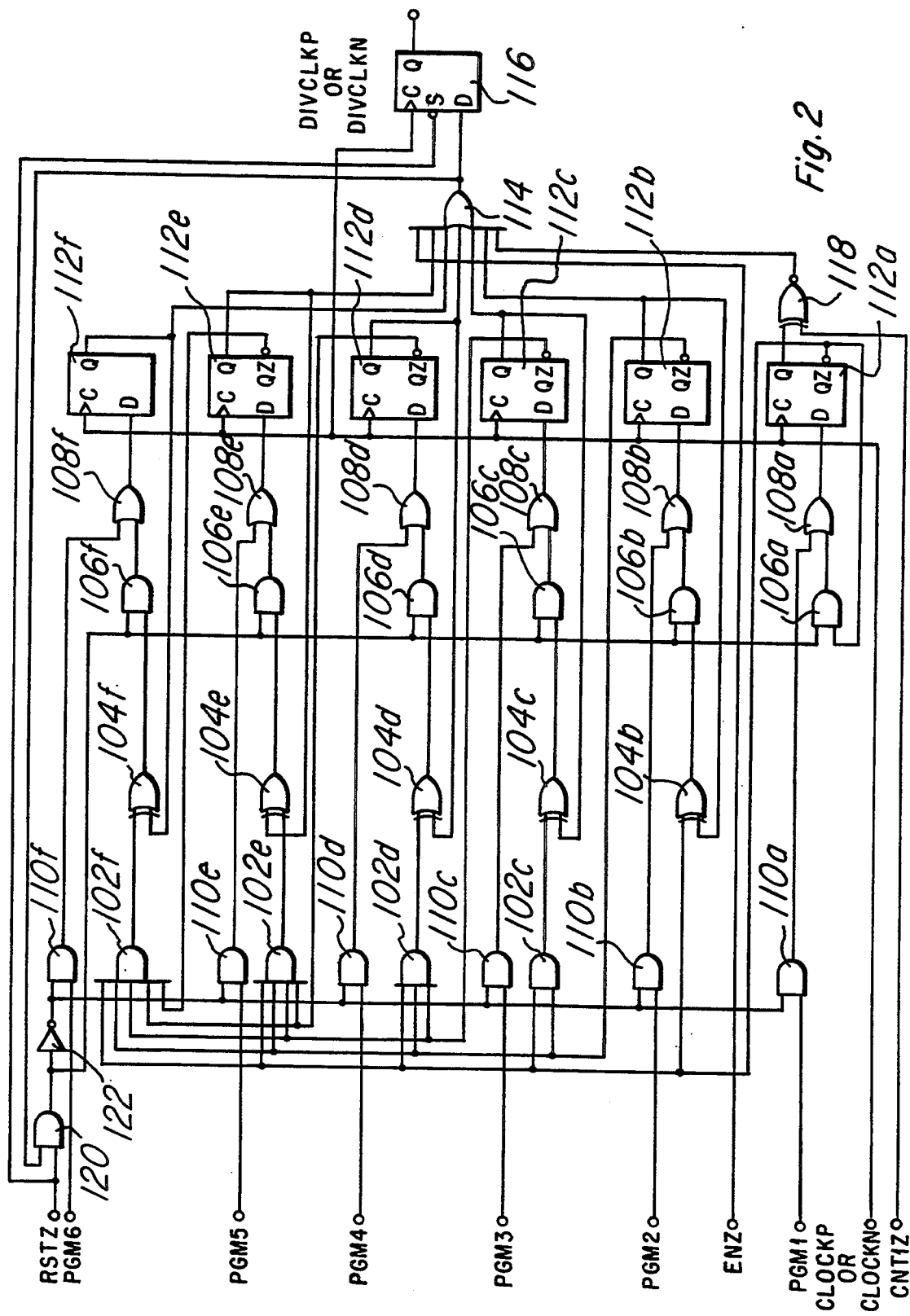
FIG. 2 is a logic diagram of down-counter which may be of the type used in the divider of FIG. 1.

Referring now to FIG. 2, there is shown a detailed logic diagram of a down-counter which may be of the type used as down-counters 10 and 12 in the frequency divider of FIG. 1. The input signals to the down-counter of FIG. 2 include RSTZ, the logic low pulse derived from the RESET input signal by the circuit elements of FIG. 1; PGM1 through PGM6, the six data signals whose binary coding presets the integer portion of the counter; CLOCKP, the positive phase of INPUT CLOCK for counter 10 or CLOCKN, the negative phase of INPUT CLOCK for counter 12; CNT1Z, the signal generated at the Q (counter 10) or QZ (counter 12) output terminal of flip-flop 58 of FIG. 1 to determine if the counter is to decode a count of zero or a count of one; and ENZ, a low logic level counter enabling signal which depends on the state of the PGM0 signal of the programmed value of the divisor for enabling counter 12 when the divisor includes a one-half count. The output signals from each of the FIG. 2 counters, DIVCLKP from counter 10 and DIVCLKN from counter 12, are coupled to the individual input terminals of AND gate 54 of FIG. 1.

The apparatus of FIG. 2 comprises a six-stage synchronous down-counter with carry look-ahead. With the exception of the carry-in logic elements, each of the six stages of the counter are substantially identical. Thus, in order to understand the entire counter, it is necessary to consider only one stage in detail, e.g., the fourth stage including gates 102d, 104d, 106d, 108d and 110d, and D-type flip-flop 112d. AND gate 102d has as inputs the QZ outputs from all preceding stages, i.e., the signals at the QZ outputs from flip-flops 112a, 112b and 112c, the first, second and third stages, respectively. The output of AND gate 102d is applied as a first input to exclusive OR gate 104d; the other input to exclusive OR gate 104d is provided from the QZ output of flip-flop 112d. The effect of this arrangement is to enable the toggling of flip-flop 112d when all of the preceding stages are reset. The output signal from gate 104d is applied to a first input of AND gate 106d; the other input is coupled to a gating signal comprising the ANDed combination of RSTZ and the output of decoding OR gate 114 provided by AND gate 120. The output signal from gate 106d is applied to a first input of OR gate 108d; the output of gate 108d is coupled to the data (D) input of flip-flop 112d.

Data signal PGM4 is coupled to a first input of AND gate 110d; the other input is coupled to a gating signal from inverter 122, which inverts the output signal from AND gate 120. The output signal from gate 110d is applied as the second input of OR gate 108d. Thus, it may be seen that, depending on the state of the signal RSTZ signal and OR gate 114, either the programmed count data signal PGM4 or the carry look-ahead count is enabled to the D input of flip-flop 112d. Flip-flop 112d is triggered by the positive-going edge of the CLOCKP (or CLOCKN) signal applied at its clock (C) input, with the result that the logic level of the signal at its D input is transferred to its Q output terminal, and its inverse is transferred to its QZ output terminal. The input terminals of decoding OR gate 114 are coupled to the Q output terminals of all of the counter flip-flops 112a through 112f, such that the logic level at its output terminal is low only when all of the flip-flops 112a-112f are reset, i.e., when the counter has counted down to zero. The exception to the zero-count decode occurs when the CNT1Z signal is enabled (logic low level), requiting a one-count decode. This is facilitated by exclusive OR gate 118, coupled at its input terminals to the CNT1Z signal and to the Q output terminal of flip-flop 112a, and having its output terminal applied to an input terminal of OR gate 114. Exclusive OR gate 118 provides a low logic level output signal when the CNT1Z signal is low and flip-flop 112a is set (count=1) or when the CNT1Z signal is high and flip-flop 112a is reset (count=0).

The decode of the appropriate final count by gate 114 causes the output of AND gate 120 to go to a low logic level and the output of inverter 122 to go to a high logic level, thereby enabling the PGM1 through PGM6 signal levels to preset flip-flops 112a through 112f through gates 110a through 110d, at the next positive transition of the CLOCKP (or CLOCKN) signal.

The output terminal of OR gate 114 is applied to the D input of flip-flop 116, whose clock input is triggered by the CLOCKP (or CLOCKN) signal, and whose preset input is coupled to the RSTZ signal. Flip-flop 116 generates at its Q output terminal the DIVCLKP (or DIVCLKN) signal. DIVCLKP from counter 10 and DIVCLKN from counter 12 are applied to the corresponding inputs of shaping circuit 14 and to the two inputs of AND gate 54 in FIG. 1. Flip-flop 116 is normally set, generating normally high logic level DIVCLKP and DIVCLKN signals. Flip-flop 116 is reset only for the period of time that its decode is achieved, thereby generating a low logic level DIVCLKP (or DIVCLKN) signal having a duration of one pulse of the CLOCKP (or CLOCKN) signal.

Figure 3:
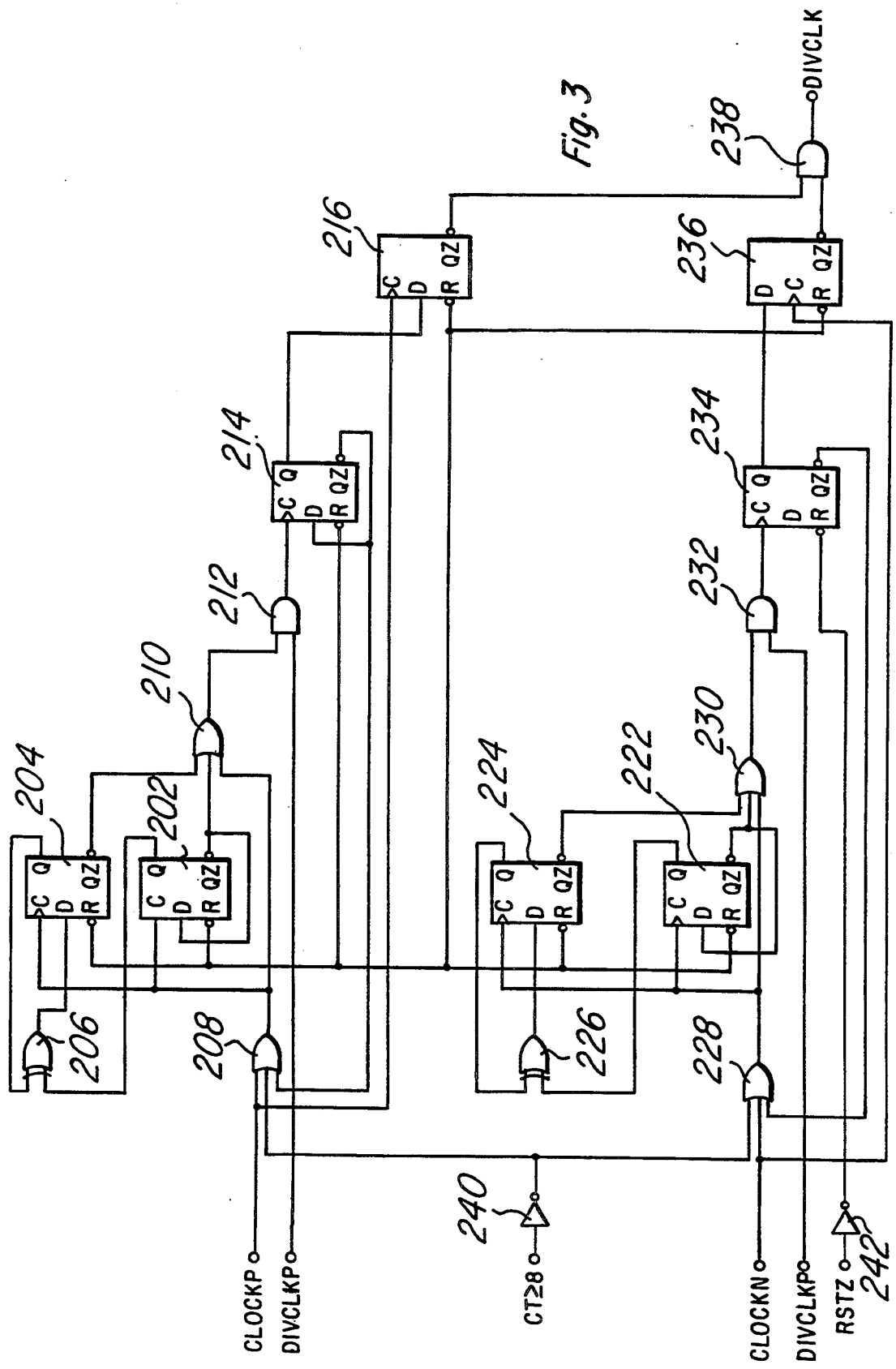
FIG. 3 is a logic diagram of a digital signal shaping circuit which may be of the type used in the divider of FIG. 1.

Referring now to FIG. 3, there is shown a detailed logic diagram of a digital signal shaping circuit which may be of the type used as shaping circuit 14 in the frequency divider of FIG. 1. The input signals to the shaping circuit of FIG. 3 include CLOCKP and CLOCKN, the normal and inverted phases, respectively, of the INPUT CLOCK signal; DIVCLKP and DIVCLKN, the divided outputs of counters 10 and 12, respectively; RSTZ, the low logic level pulse derived from the RESET input signal by the circuit elements of FIG. 1; and CT≧8, the output signal from OR gate 40 of FIG. I which decodes the programmed value of the divisor as being eight or greater. The output signal from the shaping circuit of FIG. 3, DIVCLK, is applied as the "0" input of MUX 16 of FIG. 1.

The shaping circuit serves to stretch the low-state pulse width of the frequency divider output signal to four or four-and-one-half input clock periods, for programmed values of the divisor which are eight or greater. As was noted earlier, the frequency divider of the present invention, as embodied herein, provides an output clock signal MCLK having a low-state pulse width equal to four INPUT CLOCK periods for a divisor value which is an integer, and to four-and-one-half INPUT CLOCK periods for a divisor value which is an integer-plus-one-half. In the present example, the DIVCLK output signal from shaping circuit 14 is steered through MUX 16 (of FIG. 1) when the signal levels at the "A" and "B" inputs are both low, which occurs when the value of the divisor is eight or greater.

The shaping circuit of FIG. 3 comprises two substantially identical halves. The first half comprises logic elements 202-216, and is responsive to DIVCLKP, the divided output of down counter 10, and to CLOCKP, the normal phase of the input clock signal. The second half comprises logic elements 222-236, and is responsive to DIVCLKN, the divided output of down counter 12, and to CLOCKN, the inverted phase of the input clock signal. The output signals from these two sets of logic elements, provided at the reset state output terminals (QZ) of flip-flops 216 and 236, are individually coupled to the two input terminals of AND gate 238. AND gate 238 generates the DIVCLK signal to be applied to the "0" input terminal of MUX 16 of FIG. 1. It is sufficient to describe in detail only one of the halves of the shaping circuit, illustratively, the half comprising elements 202-216.

D-type flip-flops 202 and 204 and exclusive OR gate 206 are configured as a two-bit synchronous counter. Flip-flop 202 is configured in a toggle mode, having its QZ output terminal coupled to its D input terminal. The Q output terminals of flip-flops 202 and 204 are coupled individually to the input terminals of exclusive OR gate 206, whose output terminal is coupled to the D input terminal of flip-flop 204. Flip-flops 202 and 204 are synchronously clocked at their clock (C) input terminals by the signal at the output terminal of OR gate 208. The low logic level RSTZ signal, coupled through buffer 242, is coupled to the reset (R) input terminals of flip-flops 202 and 204, causing both flip-flops to be put in the reset state upon the occurrence of the RESET signal (shown in FIG. 1). The signals at the QZ output terminals of flip-flops 202 and 204 are applied individually to two input terminals of OR gate 210; the third input terminal of OR gate 210 is coupled to the output terminal of OR gate 208.

The clocking signal to flip-flops 202 and 204 is provided from OR gate 208, which is responsive at its three input terminals to CLOCKP, the inverted state of CT≧8 provided from inverter 240, and the signal at the QZ output terminal of flip-flop 214. The latter two signals act as inhibiting signals to gate 208, permitting the CLOCKP signal to be coupled through OR gate 208 to flip-flops 202 and 204 only when they are both at logic low levels. The inverted state of CF≧8 is low when the output signal from OR gate 40 (shown in FIG. 1) has decoded the programmed value of the divisor as being eight or greater.

Flip-flop 214 is configured in a toggle mode, i.e., its reset state (QZ) output terminal is coupled to its data (D) input terminal. It is reset upon the occurrence of a logic low level pulse of the RSTZ signal, coupled through buffer 242 to its reset (R) input terminal. Its clock (C) input terminal is coupled to the output terminal of AND gate 212. AND gate 212 is coupled at a first of its input terminals to the DIVCLKP signal, and at the second of its input terminals to the output terminal of OR gate 210.

The set state output terminal (Q) of flip-flop 214 is coupled to the data (D) input terminal of D-type flip flop 216. Flip-flop 216 is triggered by the CLOCKP signal coupled at its clock (C) input terminal, and is reset upon the occurrence of a logic low level pulse of the RSTZ signal, coupled through buffer 242 to its reset (R) input terminal.

Following the occurrence of a logic low level pulse of the RSTZ signal, flip-flops 202, 204, 214 and 216 are all reset, and the output signal logic levels of gates 208 and 210 are high and gate 206 is low. Gate 212, coupled to the active-low DIVCLKP signal, is at a high logic level. Since the same conditions exist in the corresponding logic elements of the other half of the shaping circuit of FIG. 3, it will be seen that the DIVCLK signal at the output of AND gate 238 is at a high logic level at this time. It will be remembered that the shaping circuit comes into play only when the programmed value of the divisor is eight or greater; thus, it will be assumed that the logic level of the CT≧8 signal is high at all times during the description of the operation of this circuit.

No change in the logic states of the devices including elements 202-216 occurs until a low-going pulse on the signal DIVCLKP returns to its high logic level. This transition causes a positive-going transition at the output of gate 212, which sets flip-flop 214. On the next occurrence of CLOCKP, flip-flop 216 sets, resulting in a low logic level signal at its QZ output terminal. Because the setting of flip-flop 214 removes an inhibiting input from OR gate 208, the same occurrence of CLOCKP begins the clocking of the counter comprising flip-flops 202 and 204.

From the earlier-described configuration of flip-flops 202 and 204, it is seen that both flip-flops are initially reset, and following three clock pulses from gate 208, both flip-flops 202 and 204 are in their set state. At this count, and with CLOCKP at its low logic level state, the signal at the output terminal of OR gate 210 goes low. During the counting process of the counter comprising flip-flops 202 and 204, DIVCLKP remains at its high logic level state, and the output level of AND gate 212 has gone high. Thus, the low-going transition of gate 210 causes the output level of gate 212 to go low. When output signal level of OR gate 210 returns high, flip-flop 214 is clocked to its reset state. The next following pulse of CLOCKP resets flip-flop 216, and the signal at its QZ output terminal returns to its high logic level state.

Considering now both halves of the shaping circuit of FIG. 3 together, the signals at the QZ output terminals of flip-flops 216 and 236 are combined by AND gate 238 to form the DIVCLK signal, such that when either flip-flop output is at its logic low level state, DIVCLK is also at its low level state. Since the two halves of the shaping circuit are clocked at different phases of the INPUT CLOCK signal, and further in view of the foregoing description of the operation of the logic elements of the shaping circuit, it will be seen that DIVCLK will be caused to go to its low level state one period of the INPUT CLOCK following a low-going transition of the earlier of DIVCLKP or DIVCLKN, and will remain in its low state until five INPUT CLOCK periods following the low-going transition of the later of DIVCLKP or DIVCLKN. Thus, it will be recognized that DIVCLK has a duration of four-and-one-half INPUT CLOCK periods for the case where the divisor value is an integer-plus-one-half and is greater than eight.

Figure 4:
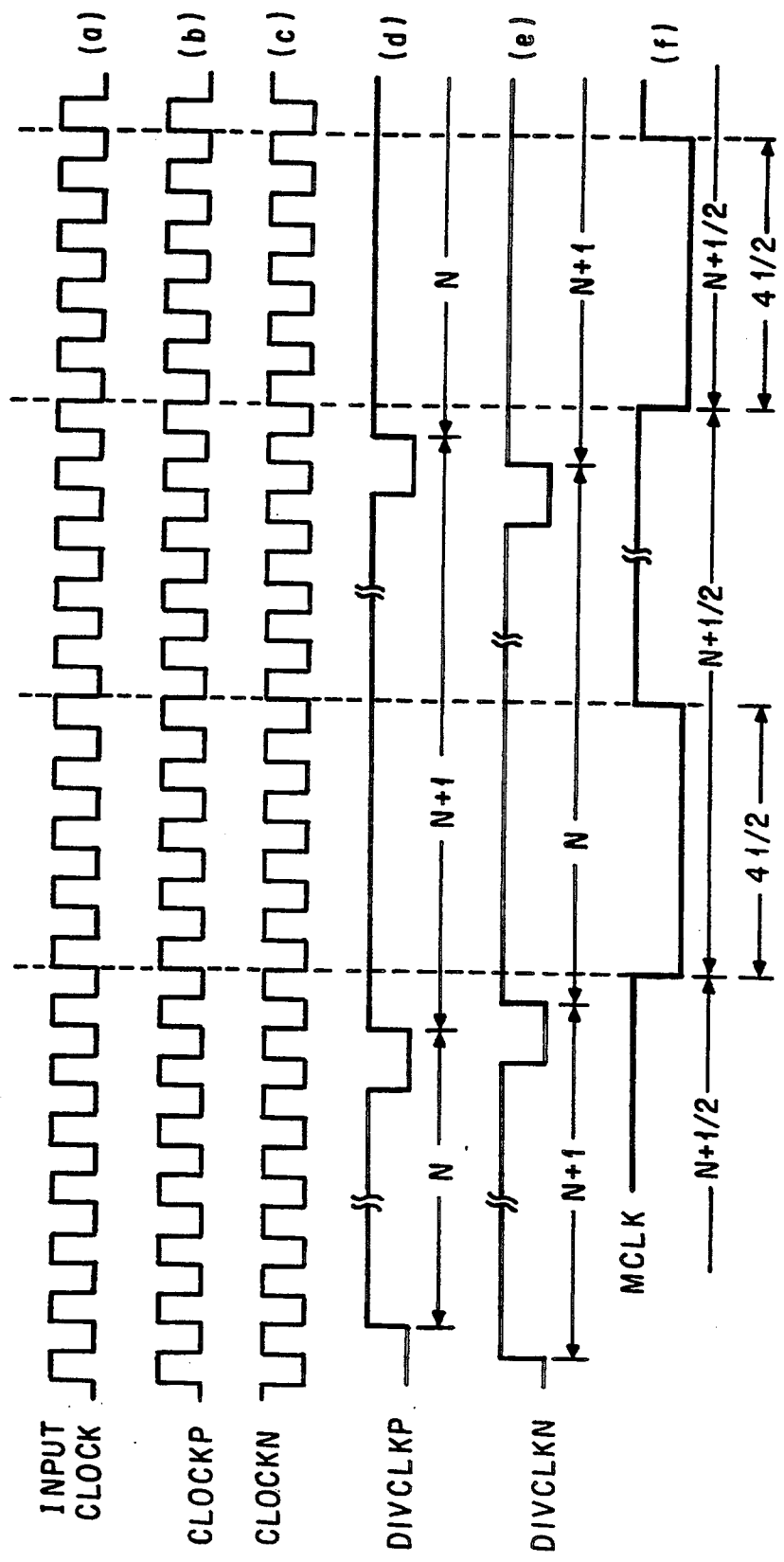
FIG. 4 is a timing diagram useful in understanding the operation of the frequency divider of FIG. 1.

Referring now to FIG. 4, there is shown a timing diagram which may be useful in understanding the operation of the frequency divider of FIG. 1. Waveform (a) illustrates the INPUT CLOCK signal, and waveforms (b) and (c) illustrate the relative phasing of the CLOCKP and CLOCKN signals generated, respectively, by buffer 28 and inverter 30 (of FIG. 1). Waveform (d) illustrates the DIVCLKP signal from counter 10 (of FIG. 1), and waveform (e) illustrates the DIVCLKN signal from counter 12 (of FIG. 1). Waveform (f) depicts the MCLK output signal from MUX 26 (of FIG. 1). These waveforms represent the specific case where the divisor is N+½, and where the value of N is eight or greater, i.e., the period of the low level pulse on MCLK is 4+½ cycles of the INPUT CLOCK signal.

At the outset of the waveforms shown in FIG. 4, counter 10 is downcounting to a decode of one, and counter 12 is downcounting to a decode of zero. When counter 10 reaches its decode count, a low level pulse of one INPUT CLOCK width is generated on DIVCLKP, and, one-half clock pulse later, counter 12 reaches its decode count, generating a low level pulse of one INPUT CLOCK width on DIVCLKN. One full INPUT CLOCK period after the rising edge of the earlier pulse (DIVCLKN, in this instance), a low level pulse of four-and-one-half periods of the INPUT CLOCK signal is generated on MCLK.

During the low level pulse on DIVCLKP, counter 10 is preset with the value of N, and during the low level pulse on DIVCLKN, counter 12 is preset with the value of N. In this instance, counter 10 is set to downcount to a decode of zero and counter 12 is set to downcount to a decode of one. The process repeats with counters 10 and 12 alternately set to decode values of one and zero, thereby generating a MCLK signal having a frequency which is the frequency of the INPUT CLOCK signal divided by N+½.

The frequency divider of the present invention, as illustrated in FIGS. 1-3 and as described above, overcomes certain limitations of prior art approaches. In particular, by separating the divider into two counters operating, respectively, from the positive-going and negative-going edges of the input clock signal, the disclosed invention imposes no requirement that any logic subsystem be capable of operation at a frequency higher than the input clock frequency itself. Hence, for an implementation of a digital divider circuit which provides the type of integer and integer-plus-a-half frequency division envisioned here, the approach in accordance with the present invention provides a significant advantage over the dividers of the prior art.

While the principles of the present invention have been demonstrated with particular regard to the structure disclosed herein, it will be recognized that various departures may be undertaken in the practice of the invention. The scope of the invention is not intended to be limited to the particular structure disclosed herein, but should instead be gauged by the breadth of the claims which follow.

What is claimed is:

1. A frequency divider circuit comprising:
   first input means for receiving an input clock signal;
   second input means for receiving data signals corresponding to a divisor value, said divisor value being either an integer or an integer plus one-half;
   first counter means responsive to said data signals and to the positive-going transitions of said input clock signal for generating a first counter signal;
   second counter means responsive to said data signals and to the negative-going transitions of said input clock signal for generating a second counter signal;
   means for combining said first and second counter signals to thereby provide an output signal having frequency equal to the frequency of said input clock signal divided by said divisor value.

2. The frequency divider in accordance with claim 1 further comprising:
   means responsive to said second input means for determining whether said divisor value is an integer or a non-integer; and
   means coupled to said determining means and to said second counter means for inhibiting the generating of said second counter signal when said determining means determines that said divisor value is an integer.

3. The frequency divider in accordance with claim 1 further comprising:
   means responsive to said second input means for determining that said divisor value is a non-integer;
   means coupled to said determining means and to said first and second counters for enabling said counters to count down continuously from the integer portion of said divisor value to a final count, said final count alternating between one and zero,
   means coupled to said determining means and to said first and second counters for providing that while one of said first and second counters counts down to one, the other of said first and second counters counts down to zero.

4. The frequency divider in accordance with claim 1 further comprising a waveform shaping circuit responsive to said divisor value for establishing the pulse width of said output signal.

5. The frequency divider in accordance with claim 4 wherein said waveform shaping circuit provides a logic low pulse of a first fixed number of input clock cycles for a divisor value less than a preselected value, and a logic low pulse of a second fixed number of input clock cycles for a divisor value greater than or equal to said preselected value.

6. A frequency divider circuit comprising:
   first input means for receiving an input clock signal;
   second input means for receiving data signals corresponding to a divisor value, said divisor value being either an integer or an integer plus one-half;
   means responsive to said second input means for determining whether said divisor value is an integer or a non-integer;
   first counter means responsive to said data signals and to the positive-going transitions of said input clock signal for generating a first counter signal;
   second counter means responsive to said data signals and to the negative-going transitions of said input clock signal for generating a second counter signal;
   means coupled to said determining means and to said second counter means for inhibiting the generating of said second counter signal when said determining means determines that said divisor value is an integer;
   means coupled to said determining means and to said first and second counters for enabling said counters to count down continuously from the integer portion of said divisor value to a final count when said determining means determines that said divisor value is a non-integer, said final count alternating between one and zero, said enabling means further providing that while one of said first and second counters counts down to one, the other of said first and second counters counts down to zero; and
   means for combining said first and second counter signals to thereby provide an output signal having frequency equal to the frequency of said input clock signal divided by said divisor value.

7. The frequency divider in accordance with claim 6 further comprising a waveform shaping circuit responsive to said divisor value for establishing the pulse width of said output signal.

8. The frequency divider in accordance with claim 7 wherein said waveform shaping circuit provides a logic low pulse of a first fixed number of input clock cycles for a divisor value less than a preselected value, and a logic low pulse of a second fixed number of input clock cycles for a divisor value greater than or equal to said preselected value.

* * * * *